(12) United States Patent
Chen

(10) Patent No.: US 11,508,791 B2
(45) Date of Patent: Nov. 22, 2022

(54) OLED DISPLAY PANEL AND DISPLAY DEVICE

(71) Applicant: Wuhan China Star Optoelectronics Semiconductor Display Technology Co., Ltd., Wuhan (CN)

(72) Inventor: Tao Chen, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 16/476,284

(22) PCT Filed: Apr. 19, 2019

(86) PCT No.: PCT/CN2019/083379
§ 371 (c)(1),
(2) Date: Jul. 6, 2019

(87) PCT Pub. No.: WO2020/133825
PCT Pub. Date: Jul. 2, 2020

(65) Prior Publication Data
US 2021/0359037 A1    Nov. 18, 2021

(30) Foreign Application Priority Data
Dec. 27, 2018  (CN) .......................... 201811606737.2

(51) Int. Cl.
*H01L 27/32* (2006.01)
*G09G 3/3266* (2016.01)
*G09G 3/3275* (2016.01)

(52) U.S. Cl.
CPC ....... *H01L 27/3234* (2013.01); *G09G 3/3266* (2013.01); *G09G 3/3275* (2013.01); *H01L 27/3218* (2013.01); *H01L 27/3276* (2013.01)

(58) Field of Classification Search
CPC ............. H01L 27/3234; H01L 27/3218; H01L 27/3276; H01L 27/3244; H01L 27/15;
(Continued)

(56) References Cited

U.S. PATENT DOCUMENTS 9,312,312 B1 * 4/2016 Tsai .................... H01L 27/3216
2014/0375534 A1 * 12/2014 Lee .................. G02F 1/136286
345/87
(Continued)

FOREIGN PATENT DOCUMENTS

| CN | 104465710 A | 3/2015 |
| CN | 104752479 A | 7/2015 |

(Continued)

*Primary Examiner* — S M Sohel Imtiaz
(74) *Attorney, Agent, or Firm* — Nathan & Associates; Menachem Nathan

(57) ABSTRACT

The present disclosure provides an organic light-emitting diode (OLED) display panel and a display device. Because, in this structure, a light transparency area is included in an electronic device display area, external light passes through the light transparency area and enters a camera. Thus, the camera can be directly positioned under the display panel without the need of forming a hole, thus solving the problems existing in prior art where the electronic device display area cannot display images due to formation of the hole. Full screen display is achieved.

9 Claims, 12 Drawing Sheets

(58) Field of Classification Search
CPC ............... G09G 3/3266; G09G 3/3275; G09G 2320/0233; G09G 3/3208
See application file for complete search history.

(56) References Cited

U.S. PATENT DOCUMENTS

| | | | |
|---|---|---|---|
| 2015/0187851 A1* | 7/2015 | Lee | H01L 27/326 438/23 |
| 2016/0329384 A1* | 11/2016 | Hou | H01L 27/3218 |
| 2017/0132965 A1* | 5/2017 | Hsu | G09G 3/2003 |
| 2017/0194406 A1* | 7/2017 | Choi | H01L 27/3262 |
| 2018/0012942 A1* | 1/2018 | Adachi | H01L 27/326 |
| 2019/0138783 A1 | 5/2019 | Yang et al. | |

FOREIGN PATENT DOCUMENTS

| | | | | |
|---|---|---|---|---|
| CN | 108962951 A | * | 12/2018 | ........... G06F 3/0412 |
| CN | 108962951 A | | 12/2018 | |
| CN | 109063631 A | | 12/2018 | |

* cited by examiner

OLED DISPLAY PANEL AND DISPLAY DEVICE

FIELD OF INVENTION

The present disclosure relates to a field of display technology, and more particularly to an organic light-emitting diode (OLED) display panel and a display device.

BACKGROUND

Mobile phones with full screen design have extremely high viewing area-to-screen ratios and give users excellent user experience, and thus have become one of the most popular techniques.

With development of full screen designs, there is a trend that electronic devices, such as a camera, are disposed under display screens. According to prior art, to ensure that electronic devices, such as a camera, disposed under display screens can receive enough light, layers including thin film transistor (TFT) circuits, light-emitting layers, cathode structures, etc. for displaying images and positioned above the camera are removed. That is, a hole formation technique is required to achieve such an objective. However, for such a hole formation technique, because the layers for displaying images in the hole formation region have been removed, the hole formation region cannot display images. This is not really a full screen design.

SUMMARY OF DISCLOSURE

The present disclosure provides an organic light-emitting diode (OLED) display panel and a display device to solve the problems existing in prior art, where formation of a hole is required for full screen display technique.

To solve the aforementioned problems, the present disclosure provides the following technical schemes.

The present disclosure provides an organic light-emitting diode (OLED) display panel comprising an electronic device display area positioned to correspond to an electronic device, wherein the electronic device display area comprises a plurality of repeating units arranged in an array, and each of the repeating units comprises at least one pixel unit disposed therein, each of the repeating units comprising:

a pixel circuit area including a circuit region defined by a plurality of driving circuits densely disposed in sub-pixels of the pixel unit, a scan line region defined by a plurality of scan lines densely disposed in sub-pixels of the pixel unit, and a data line region defined by a plurality of data lines densely disposed in sub-pixels of the pixel unit; and a light transparency area including a portion of the electronic device display area where the pixel circuit area is not included, the light transparency area not including a light shielding material disposed therein;

wherein a light-emitting layer of at least one sub-pixel in the pixel unit is disposed in at least two of the circuit region, the scan line region, and the data line region.

In the OLED display panel of the present disclosure, each of the repeating units comprises one pixel unit; the pixel unit includes a first sub-pixel, a second sub-pixel, and a third sub-pixel; and a light-emitting layer of the first sub-pixel is disposed in the scan line region.

In the OLED display panel of the present disclosure, both a light-emitting layer of the second sub-pixel and a light-emitting layer of the third sub-pixel are disposed in the circuit region and the data line region.

In the OLED display panel of the present disclosure, a light-emitting layer of the second sub-pixel is disposed in the circuit region, and a light-emitting layer of the third sub-pixel is disposed in the circuit region and the data line region.

In the OLED display panel of the present disclosure, a light-emitting layer of the second sub-pixel is disposed in the circuit region, the scan line region, and the data line region; and a light-emitting layer of the third sub-pixel is disposed in the circuit region and the data line region.

In the OLED display panel of the present disclosure, each of the repeating units comprises one pixel unit; the pixel unit includes a first sub-pixel, a second sub-pixel, and a third sub-pixel; and a light-emitting layer of the first sub-pixel is disposed in the scan line region and the circuit region.

In the OLED display panel of the present disclosure, a light-emitting layer of the second sub-pixel is disposed in the circuit region and the scan line region; and a light-emitting layer of the third sub-pixel is disposed in the circuit region and the data line region.

In the OLED display panel of the present disclosure, a light-emitting layer of the second sub-pixel is disposed in the circuit region and the scan line region; and a light-emitting layer of the third sub-pixel is disposed in the circuit region, the scan line region, and the data line region.

In the OLED display panel of the present disclosure, each of the repeating units comprises one pixel unit; the pixel unit includes a first sub-pixel, a second sub-pixel, and a third sub-pixel; the first sub-pixel is disposed along the light transparency area, the third sub-pixel is disposed along the light transparency area, and the second sub-pixel is disposed between the first sub-pixel and the third sub-pixel; and the first sub-pixel is symmetrical to the third sub-pixel with respect to an axis line of the second sub-pixel.

In the OLED display panel of the present disclosure, an opening of a pixel defining layer configured for defining the first sub-pixel has an L shape, an opening of a pixel defining layer configured for defining the second sub-pixel has a rectangular shape, and an opening of a pixel defining layer configured for defining the third sub-pixel has an L shape.

In the OLED display panel of the present disclosure, the scan line region includes a first scan line region and a second scan line region; the data line region includes a first data line region and a second data line region; each of the repeating units comprises two pixel units; the two pixel units are arranged in a mirror image of each other with respect to a central line of the data line region; each of the pixel units includes a first sub-pixel, a second sub-pixel, and a third sub-pixel; a light-emitting layer of the first sub-pixel is disposed in the first scan line region, the circuit region, and the first data line region; a light-emitting layer of the second sub-pixel is disposed in the circuit region and the first data line region; and a light-emitting layer of the third sub-pixel is disposed in the first data line region, the circuit region, and the second scan line region.

In the OLED display panel of the present disclosure, each of the repeating units comprises a first pixel unit and a second pixel unit arranged in a mirror image of each other in a vertical direction; the first pixel unit includes a first red sub-pixel, a first green sub-pixel, and a first blue sub-pixel; the second pixel unit includes a second red sub-pixel, a second green sub-pixel, and a second blue sub-pixel; the first red sub-pixel, the first blue sub-pixel, the second red sub-pixel, and the second blue sub-pixel are disposed along the light transparency area; the first green sub-pixel is disposed between the first red sub-pixel and the first blue sub-pixel, and the second green sub-pixel is disposed between the second red sub-pixel and the second blue sub-pixel.

In the OLED display panel of the present disclosure, an opening of a pixel defining layer configured for defining the first red sub-pixel and an opening of a pixel defining layer configured for defining the first blue sub-pixel have an L shape, and the L shape of the opening of the pixel defining layer configured for defining the first red sub-pixel is symmetrical to the L shape of the opening of the pixel defining layer configured for defining the first blue sub-pixel in a horizontal direction, an opening of a pixel defining layer configured for defining the first green sub-pixel has a rectangular shape; and an opening of a pixel defining layer configured for defining the second red sub-pixel and an opening of a pixel defining layer configured for defining the second blue sub-pixel have an upside-down L shape, and the upside-down L shape of the opening of the pixel defining layer configured for defining the second red sub-pixel is symmetrical to the upside-down L shape of the opening of the pixel defining layer configured for defining the second blue sub-pixel in the horizontal direction, an opening of a pixel defining layer configured for defining the second green sub-pixel has a rectangular shape.

In the OLED display panel of the present disclosure, the scan line region includes a first scan line region and a second scan line region; the data line region includes a first data line region and a second data line region; each of the repeating units comprises four pixel units, the four pixel units are symmetrical to each other with respect to a center of the circuit region; each of the pixel units includes a first sub-pixel, a second sub-pixel, and a third sub-pixel; a light-emitting layer of the first sub-pixel is disposed in the first scan line region; both a light-emitting layer of the second sub-pixel and a light-emitting layer of the third sub-pixel are disposed in the circuit region and the first data line region.

In the OLED display panel of the present disclosure, the OLED display panel further comprises a standard display area surrounding the electronic device display area, wherein any two adjacent pixels in the electronic device display area do not share a sub-pixel, and any two adjacent pixels in the standard display area share a sub-pixel.

In addition, the present disclosure provides a display device comprising an organic light-emitting diode (OLED) display panel, the OLED display panel comprising an electronic device display area positioned to correspond to an electronic device, wherein the electronic device display area comprises a plurality of repeating units arranged in an array, and each of the repeating units comprises at least one pixel unit disposed therein, each of the repeating units comprising:

a pixel circuit area including a circuit region defined by a plurality of driving circuits densely disposed in sub-pixels of the pixel unit, a scan line region defined by a plurality of scan lines densely disposed in sub-pixels of the pixel unit, and a data line region defined by a plurality of data lines densely disposed in sub-pixels of the pixel unit; and a light transparency area including a portion of the electronic device display area where the pixel circuit area is not included, the light transparency area not including a light shielding material disposed therein;

wherein a light-emitting layer of at least one sub-pixel in the pixel unit is disposed in at least two of the circuit region, the scan line region, and the data line region.

In the display device of the present disclosure, each of the repeating units comprises one pixel unit; the pixel unit includes a first sub-pixel, a second sub-pixel, and a third sub-pixel; and a light-emitting layer of the first sub-pixel is disposed in the scan line region.

In the display device of the present disclosure, both a light-emitting layer of the second sub-pixel and a light-emitting layer of the third sub-pixel are disposed in the circuit region and the data line region.

In the display device of the present disclosure, a light-emitting layer of the second sub-pixel is disposed in the circuit region, and a light-emitting layer of the third sub-pixel is disposed in the circuit region and the data line region.

In the display device of the present disclosure, a light-emitting layer of the second sub-pixel is disposed in the circuit region, the scan line region, and the data line region; and a light-emitting layer of the third sub-pixel is disposed in the circuit region and the data line region.

The beneficial effects provided by the present disclosure are described below. The present disclosure provides an organic light-emitting diode (OLED) display panel and a display device, which include an electronic device display area positioned to correspond to an electronic device. The electronic device display area includes a plurality of repeating units arranged in an array. Each of the repeating units includes at least one pixel unit disposed therein. Each of the repeating units includes: a pixel circuit area including a circuit region defined by a plurality of driving circuits densely disposed in sub-pixels of the pixel unit, a scan line region defined by a plurality of scan lines densely disposed in sub-pixels of the pixel unit, and a data line region defined by a plurality of data lines densely disposed in sub-pixels of the pixel unit; and a light transparency area including a portion of the electronic device display area where the pixel circuit area is not included, the light transparency area not including a light shielding material disposed therein; wherein a light-emitting layer of at least one sub-pixel in the pixel unit is disposed in at least two of the circuit region, the scan line region, and the data line region. Because, in this structure, a light transparency area is included in the electronic device display area, external light passes through the light transparency area and enters the camera. Thus, the camera can be directly positioned under the display panel without the need of forming a hole, thus solving the problems existing in prior art where the electronic device display area cannot display images due to formation of the hole. Full screen display is achieved. In the meanwhile, because the light-emitting layer of the sub-pixels is disposed in at least two of the circuit region, the scan line region, and the data line region, aperture ratio of the pixels is increased.

BRIEF DESCRIPTION OF DRAWINGS

To detailedly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

In order to make objects, technical details and advantages of the embodiments of the invention apparent, the technical solution of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Direction terms mentioned in this disclosure, for example, "up", "down", "front", "rear", "left", "right", "inside", "outside", and "side", are merely directions in the accompanying drawings. Therefore, the direction terms are used to describe and understand the present disclosure, but not intended to limit the invention. Terms such as "first" and "second" are used herein for purposes of description and are not intended to indicate or imply relative importance or significance or to imply the number of indicated technical features. Thus, the feature defined with "first" and "second" may include one or more of this feature.

Figure 1:
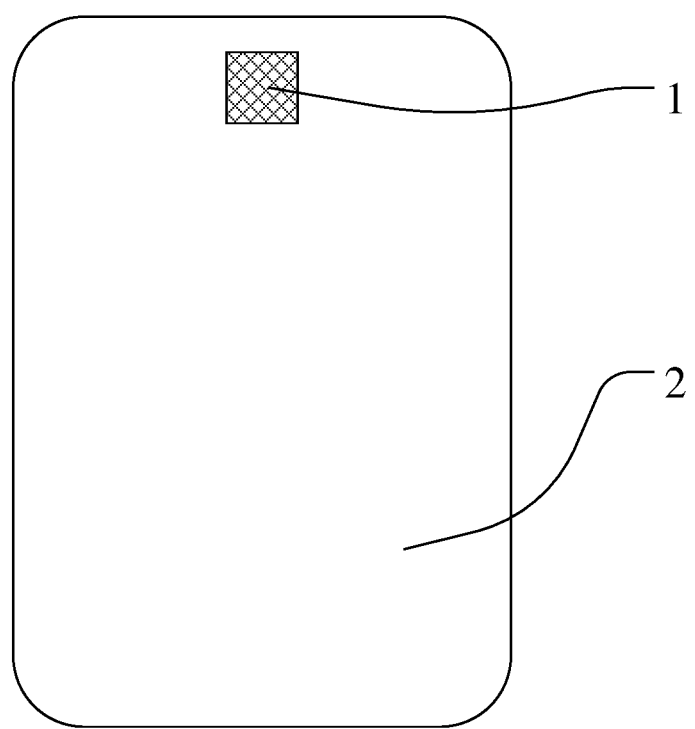
FIG. 1 is a schematic diagram showing a structure of an organic light-emitting diode (OLED) display panel according to one embodiment of the present disclosure.

The present disclosure provides a display panel. As shown in FIG. 1, the display panel includes an electronic device display area 1 and a standard display area 2 (i.e., a portion of the display area excluding the electronic device display area 1).

The electronic device display area 1 is on the display panel. A Size, shape, and position of the electronic device display area 1 are not limited to a specific selection, and are determined based on cameras disposed in mobile phone terminals. Generally, the electronic device display area 1 has a size (diameter or length/width) of 3-8 mm, and has a circle or rectangular shape. Certainly, to meet desired needs, the electronic device display area 1 could have other sizes and shapes.

Figure 2:
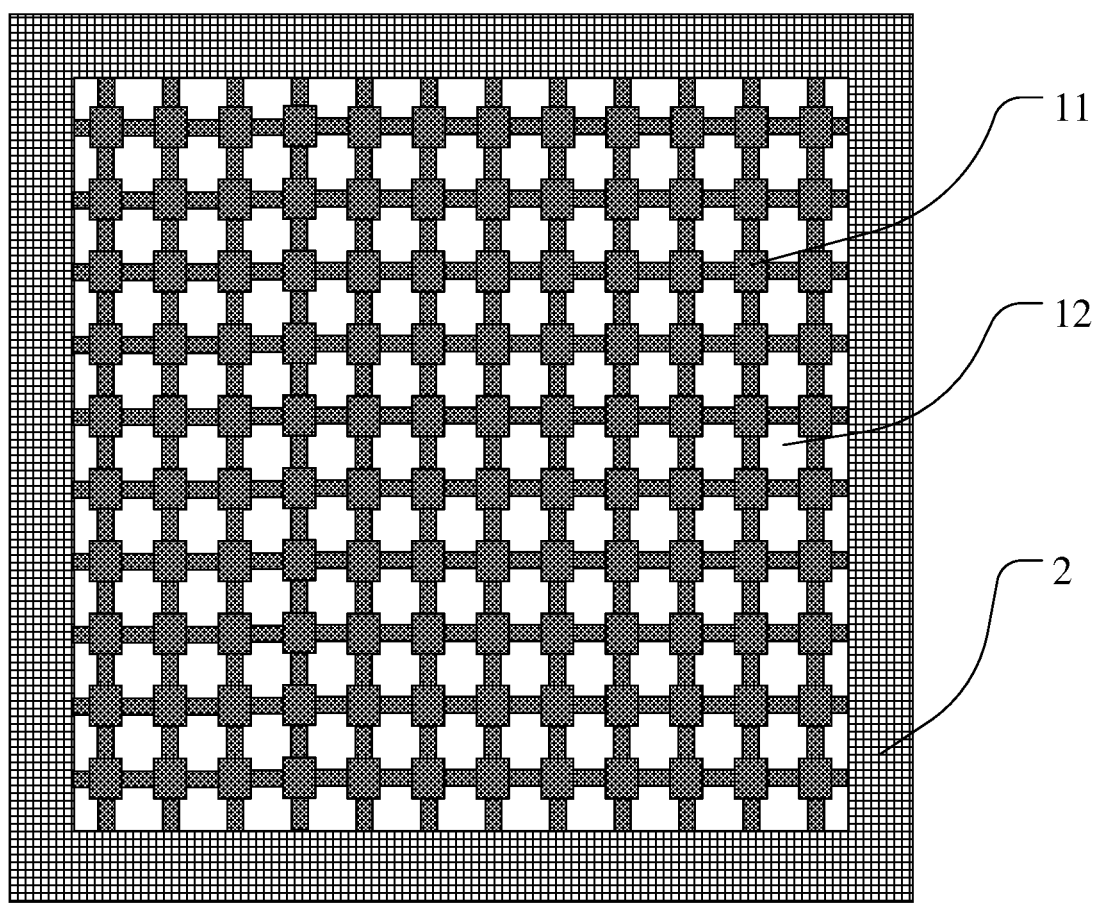
FIG. 2 is a schematic diagram showing a partial structure of an OLED display panel according to one embodiment of the present disclosure.

FIG. 2 is a schematic diagram showing a partial structure of a display panel, where an electronic device display area is shown. The density of pixels in the electronic device display area 1 is lower than the density of pixels in the standard display area 2. Specifically, the density of pixels in the electronic device display area 1 and the density of pixels in the standard display area 2 are determined based on light transmittance of panels and image displaying effects.

To lower the density of pixels, the pixel circuit metal wirings, the data line metal wirings, and the scan line metal wirings which are disposed in the electronic device display area 1 and which are opaque to light are reduced in number. Moreover, in the meanwhile, the pixel circuit metal wirings, the data line metal wirings, and the scan line metal wirings are arranged to have a wiring gathered design. As such, the metal wirings that are opaque to light and have the wiring gathered design form a loosely distributed grid pattern, as shown in FIG. 2, thus retaining an area in which there are not any metal wirings disposed and which is transparent to light for use in cameras.

Because the density of pixels in the electronic device display area 1 is lowered, and in order to keep this area and the standard display area 2 to have a same brightness, density of electrical current used for OLED pixels in this area has to be increased. This adversely accelerates the aging speed of OLED devices in the electronic device display area 1, and thus the brightness difference between the electronic device display area 1 and the standard display area 2 is getting greater.

To solve this problem, the present disclosure provides a technical design, which increases an aperture ratio of the pixels in the electronic device display area 1.

According to the present disclosure, the electronic device display area 1 includes a plurality of repeating units arranged in an array. As shown in FIGS. 3-20, the repeating units includes at least one pixel unit disposed therein. Each of the repeating units includes:

a pixel circuit area 11 including a circuit region 111 defined by a plurality of driving circuits densely disposed in sub-pixels of the pixel unit, a scan line region 112 defined by a plurality of scan lines densely disposed in sub-pixels of the pixel unit, and a data line region 113 defined by a plurality of data lines densely disposed in sub-pixels of the pixel unit; and a light transparency area 12 including a portion of the electronic device display area where the pixel circuit area is not included, the light transparency area not including a light shielding material disposed therein;

wherein a light-emitting layer of at least one sub-pixel in the pixel unit is disposed in at least two of the circuit region 111, the scan line region 112, and the data line region 113.

Figure 3:
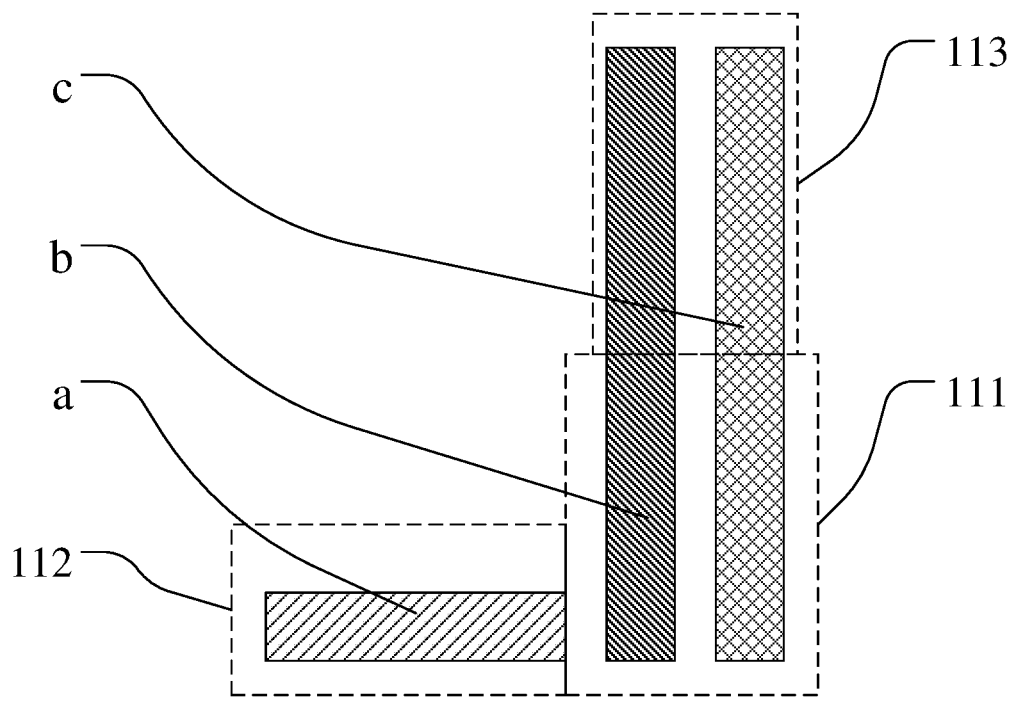
FIG. 3 is a schematic diagram showing a first pixel design in a repeating unit according to one embodiment of the present disclosure.

FIG. 3 is a schematic diagram showing a first pixel design in the repeating unit in the electronic device display area 1 according to the present disclosure. As shown in FIG. 3, each of the repeating units includes one pixel unit. The pixel unit includes a first sub-pixel a, a second sub-pixel b, and a third sub-pixel c. A light-emitting layer of the first sub-pixel a is disposed in the scan line region 112. Both a light-emitting layer of the second sub-pixel b and a light-emitting layer of the third sub-pixel c are disposed in the circuit region 111 and the data line region 113.

Figure 4:
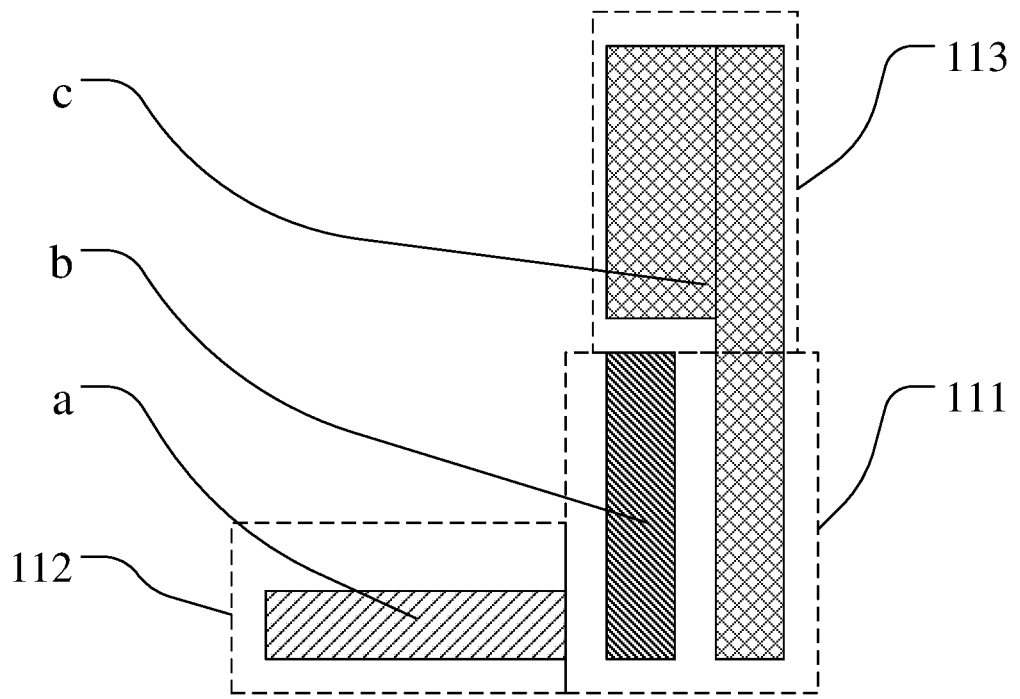
FIG. 4 is a schematic diagram showing a second pixel design in a repeating unit according to one embodiment of the present disclosure.

FIG. 4 is a schematic diagram showing a second pixel design in the repeating unit in the electronic device display area 1 according to the present disclosure. As shown in FIG. 4, each of the repeating units includes one pixel unit. The pixel unit includes a first sub-pixel a, a second sub-pixel b, and a third sub-pixel c. A light-emitting layer of the first sub-pixel a is disposed in the scan line region 112. A light-emitting layer of the second sub-pixel b is disposed in the circuit region 111. A light-emitting layer of the third sub-pixel c is disposed in the circuit region 111 and the data line region 113.

Figure 5:
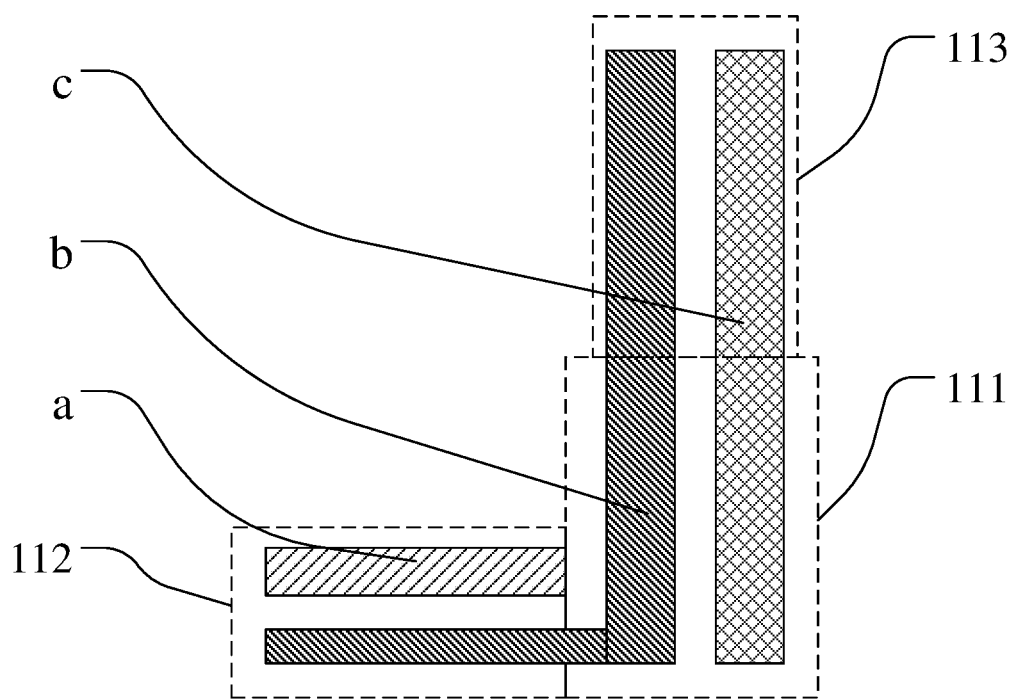
FIG. 5 is a schematic diagram showing a third pixel design in a repeating unit according to one embodiment of the present disclosure.

FIG. 5 is a schematic diagram showing a third pixel design in the repeating unit in the electronic device display area 1 according to the present disclosure. As shown in FIG. 5, each of the repeating units includes one pixel unit. The pixel unit includes a first sub-pixel a, a second sub-pixel b, and a third sub-pixel c. A light-emitting layer of the first sub-pixel a is disposed in the scan line region 112. A light-emitting layer of the second sub-pixel b is disposed in the circuit region 111, the scan line region 112, and the data line region 113. A light-emitting layer of the third sub-pixel c is disposed in the circuit region 111 and the data line region 113.

Figure 6:
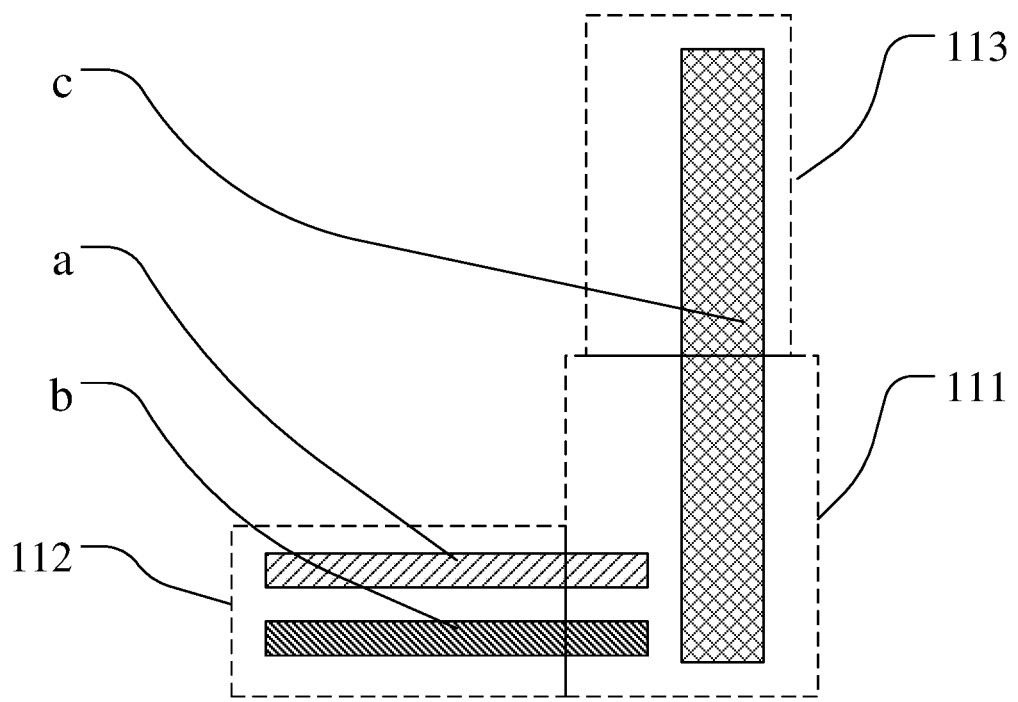
FIG. 6 is a schematic diagram showing a fourth pixel design in a repeating unit according to one embodiment of the present disclosure.

FIG. 6 is a schematic diagram showing a fourth pixel design in the repeating unit in the electronic device display area 1 according to the present disclosure. As shown in FIG. 6, each of the repeating units includes one pixel unit. The pixel unit includes a first sub-pixel a, a second sub-pixel b, and a third sub-pixel c. Both a light-emitting layer of the first sub-pixel a and a light-emitting layer of the second sub-pixel b are disposed in the scan line region 112 and the circuit region 111. A light-emitting layer of the third sub-pixel c is disposed in the circuit region 111 and the data line region 113.

Figure 7:
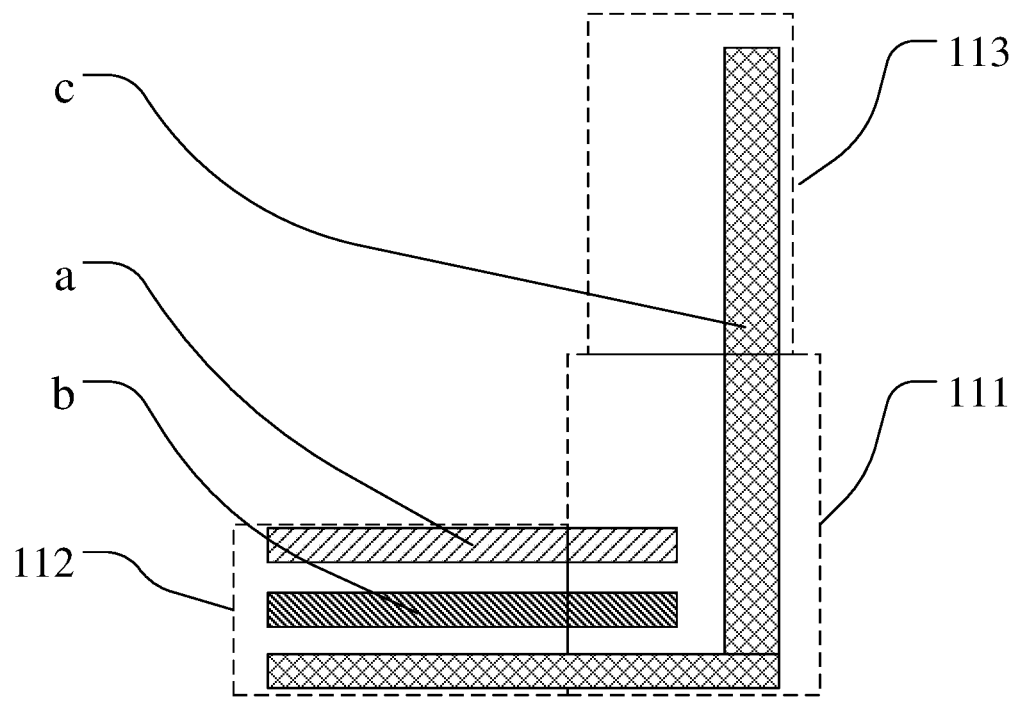
FIG. 7 is a schematic diagram showing a fifth pixel design in a repeating unit according to one embodiment of the present disclosure.

FIG. 7 is a schematic diagram showing a fifth pixel design in the repeating unit in the electronic device display area 1 according to the present disclosure. As shown in FIG. 7, each of the repeating units includes one pixel unit. The pixel unit includes a first sub-pixel a, a second sub-pixel b, and a third sub-pixel c. Both a light-emitting layer of the first sub-pixel a and a light-emitting layer of the second sub-pixel b are disposed in the scan line region 112 and the circuit region 111. A light-emitting layer of the third sub-pixel c is disposed in the circuit region 111, the scan line region 112, and the data line region 113.

Figure 8:
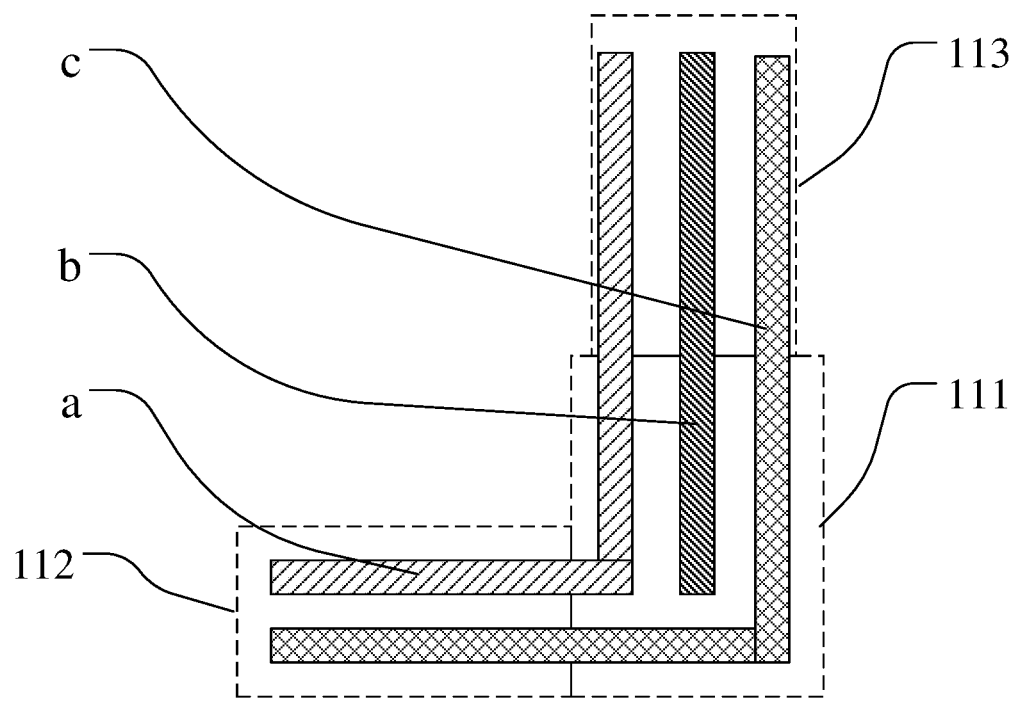
FIG. 8 is a schematic diagram showing a sixth pixel design in a repeating unit according to one embodiment of the present disclosure.

FIG. 8 is a schematic diagram showing a sixth pixel design in the repeating unit in the electronic device display area 1 according to the present disclosure. As shown in FIG. 8, each of the repeating units includes one pixel unit. The pixel unit includes a first sub-pixel a, a second sub-pixel b, and a third sub-pixel c. Both a light-emitting layer of the first sub-pixel a and a light-emitting layer of the third sub-pixel c are disposed in the circuit region 111, the scan line region 112, and the data line region 113. A light-emitting layer of the second sub-pixel b is disposed in the circuit region 111 and the data line region 113.

Figure 9:
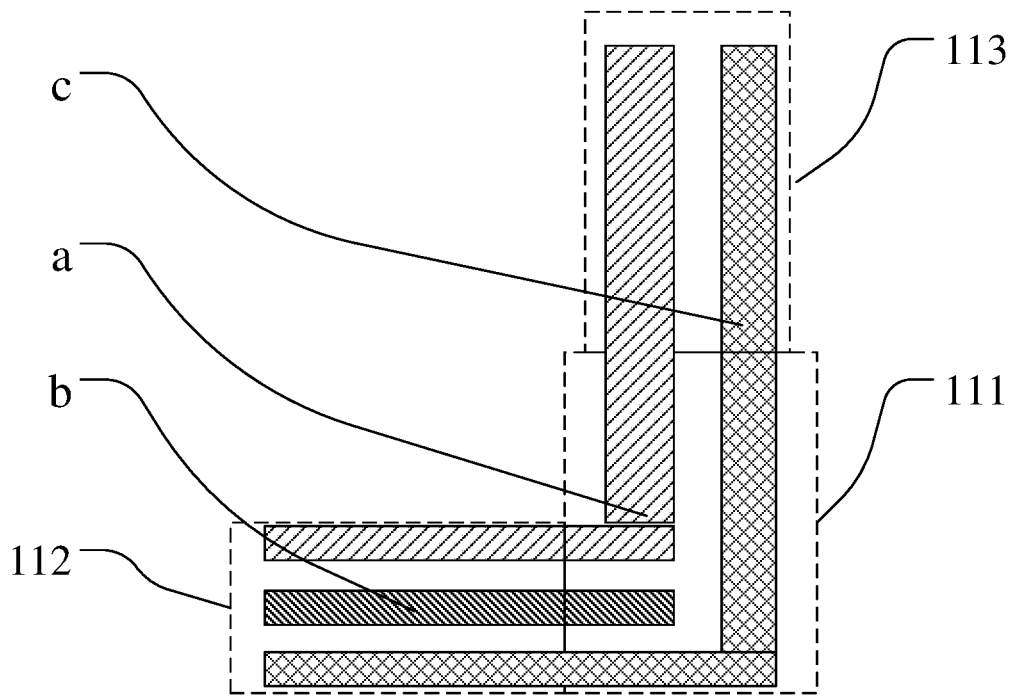
FIG. 9 is a schematic diagram showing a seventh pixel design in a repeating unit according to one embodiment of the present disclosure.

FIG. 9 is a schematic diagram showing a seventh pixel design in the repeating unit in the electronic device display area 1 according to the present disclosure. As shown in FIG. 9, each of the repeating units includes one pixel unit. The pixel unit includes a first sub-pixel a, a second sub-pixel b, and a third sub-pixel c. Both a light-emitting layer of the first sub-pixel a and a light-emitting layer of the third sub-pixel c are disposed in the circuit region 111, the scan line region 112, and the data line region 113. A light-emitting layer of the second sub-pixel b is disposed in the circuit region 111 and the scan line region 112.

Figure 10:
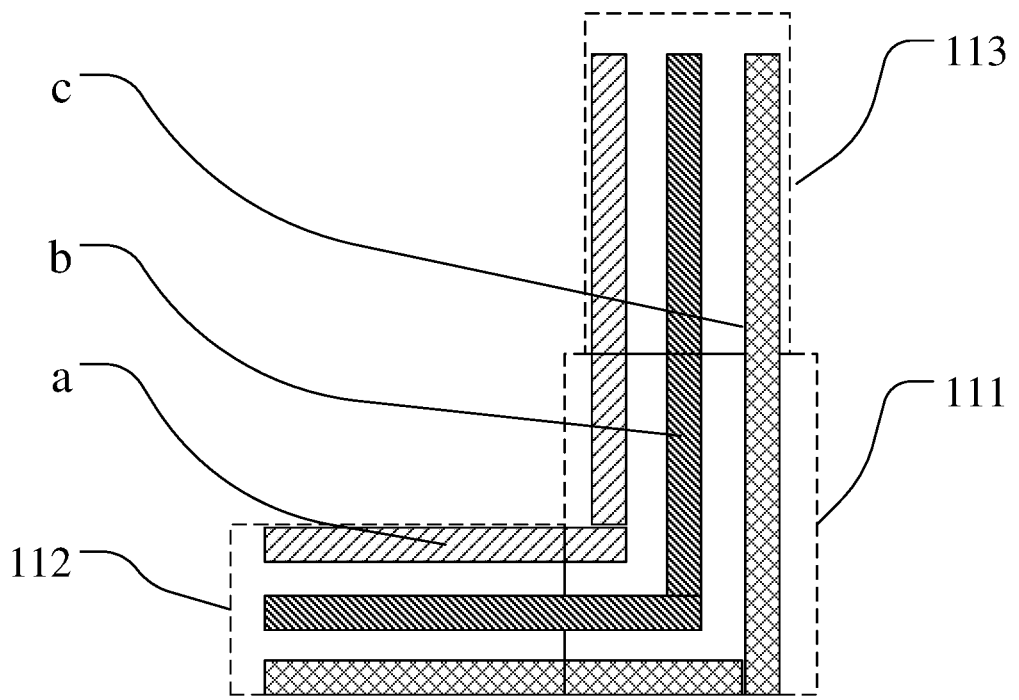
FIG. 10 is a schematic diagram showing an eighth pixel design in a repeating unit according to one embodiment of the present disclosure.

FIG. 10 is a schematic diagram showing an eighth pixel design in the repeating unit in the electronic device display area 1 according to the present disclosure. As shown in FIG. 10, each of the repeating units includes one pixel unit. The pixel unit includes a first sub-pixel a, a second sub-pixel b, and a third sub-pixel c. Both a light-emitting layer of the first sub-pixel a, a light-emitting layer of the second sub-pixel b, and a light-emitting layer of the third sub-pixel c are disposed in the circuit region 111, the scan line region 112, and the data line region 113.

Figure 11:
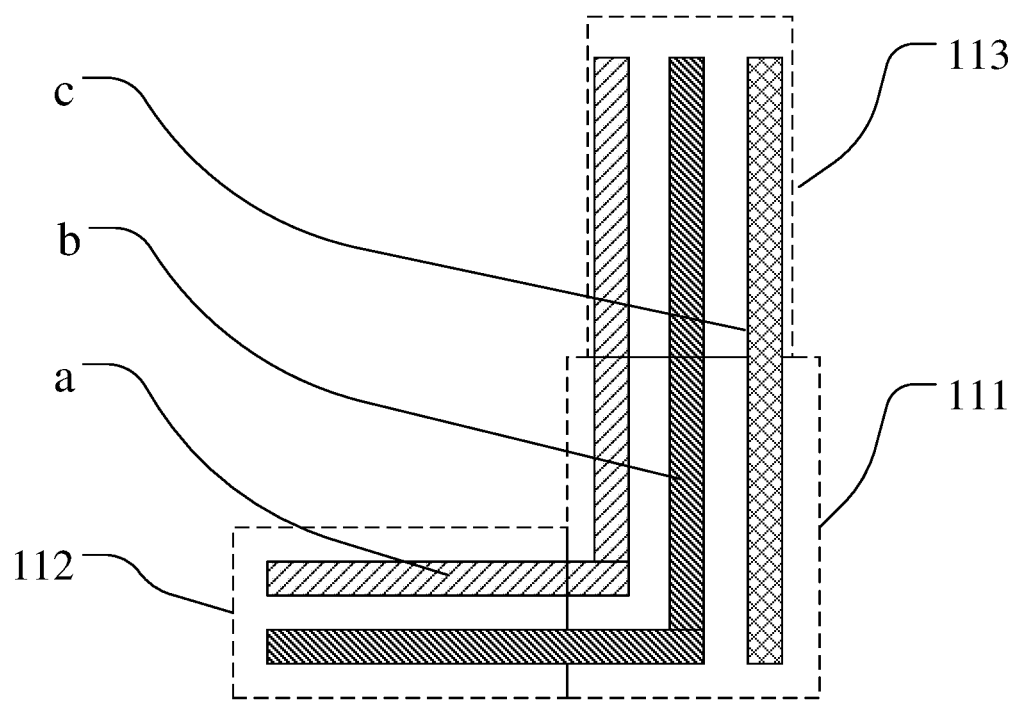
FIG. 11 is a schematic diagram showing a ninth pixel design in a repeating unit according to one embodiment of the present disclosure.

FIG. 11 is a schematic diagram showing a ninth pixel design in the repeating unit in the electronic device display area 1 according to the present disclosure. As shown in FIG. 11, each of the repeating units includes one pixel unit. The pixel unit includes a first sub-pixel a, a second sub-pixel b, and a third sub-pixel c. Both a light-emitting layer of the first sub-pixel a and a light-emitting layer of the second sub-pixel b are disposed in the circuit region 111, the scan line region 112, and the data line region 113. A light-emitting layer of the third sub-pixel c is disposed in the circuit region 111 and the data line region 113.

Figure 12:
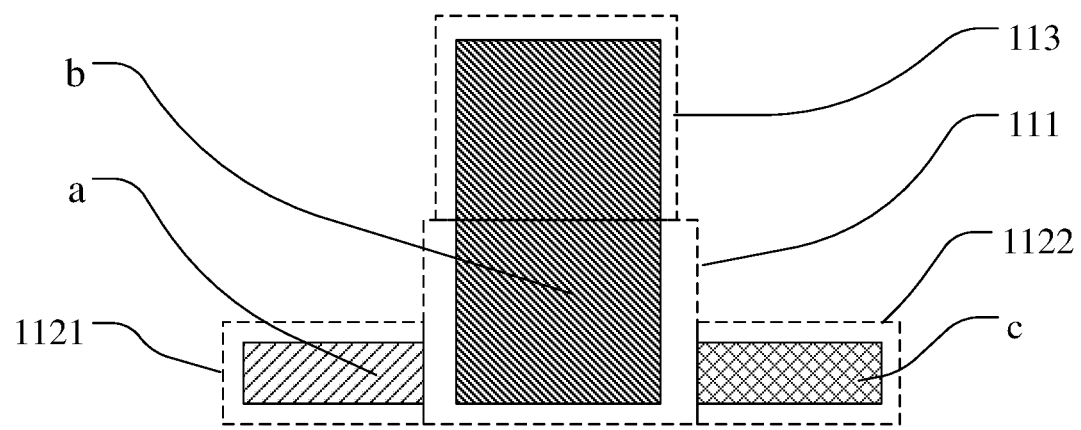
FIG. 12 is a schematic diagram showing a tenth pixel design in a repeating unit according to one embodiment of the present disclosure.

FIG. 12 is a schematic diagram showing a tenth pixel design in the repeating unit in the electronic device display area 1 according to the present disclosure. As shown in FIG. 12, each of the repeating units includes one pixel unit. The pixel unit includes a first sub-pixel a, a second sub-pixel b, and a third sub-pixel c. The scan line region 112 includes a first scan line region 1121 and a second scan line region 1122. A light-emitting layer of the first sub-pixel a is disposed in the first scan line region 1121. A light-emitting layer of the second sub-pixel b is disposed in the circuit region 111 and the data line region 113. A light-emitting layer of the third sub-pixel c is disposed in the second scan line region 1122.

Figure 13:
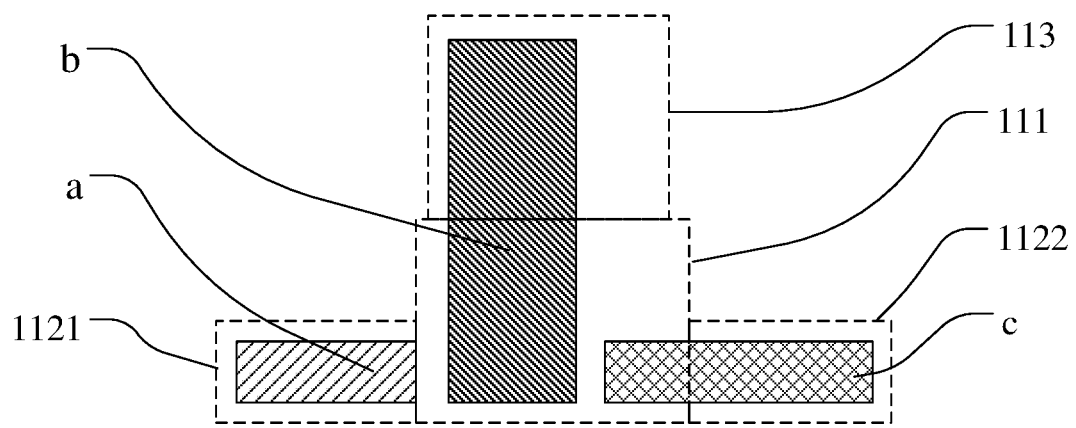
FIG. 13 is a schematic diagram showing an eleventh pixel design in a repeating unit according to one embodiment of the present disclosure.

FIG. 13 is a schematic diagram showing an eleventh pixel design in the repeating unit in the electronic device display area 1 according to the present disclosure. As shown in FIG. 13, each of the repeating units includes one pixel unit. The pixel unit includes a first sub-pixel a, a second sub-pixel b, and a third sub-pixel c. The scan line region 112 includes a first scan line region 1121 and a second scan line region 1122. A light-emitting layer of the first sub-pixel a is disposed in the first scan line region 1121. A light-emitting layer of the second sub-pixel b is disposed in the circuit region 111 and the data line region 113. A light-emitting layer of the third sub-pixel c is disposed in the circuit region 111 and the second scan line region 1122.

Figure 14:
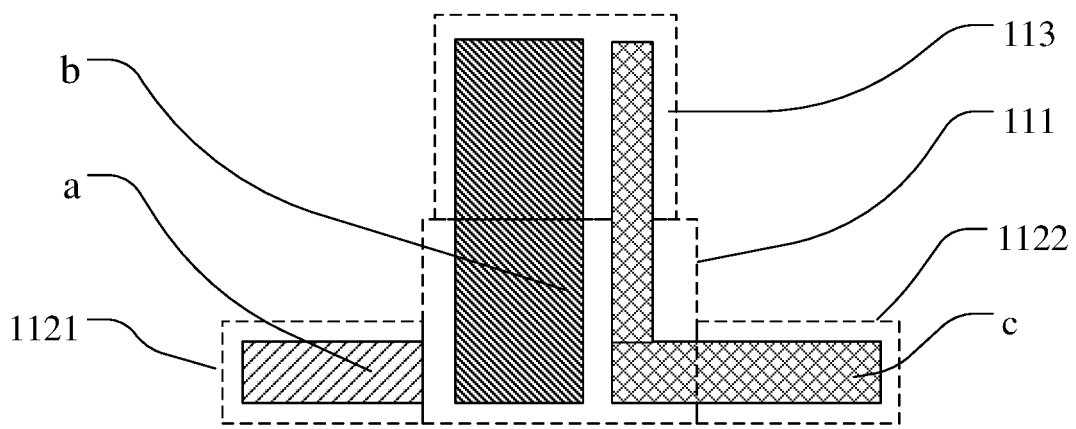
FIG. 14 is a schematic diagram showing a twelfth pixel design in a repeating unit according to one embodiment of the present disclosure.

FIG. 14 is a schematic diagram showing a twelfth pixel design in the repeating unit in the electronic device display area 1 according to the present disclosure. As shown in FIG.

14, each of the repeating units includes one pixel unit. The pixel unit includes a first sub-pixel a, a second sub-pixel b, and a third sub-pixel c. The scan line region 112 includes a first scan line region 1121 and a second scan line region 1122. A light-emitting layer of the first sub-pixel a is disposed in the first scan line region 1121. A light-emitting layer of the second sub-pixel b is disposed in the circuit region 111 and the data line region 113. A light-emitting layer of the third sub-pixel c is disposed in the circuit region 111, the data line region 113, and the second scan line region 1122.

Figure 15:
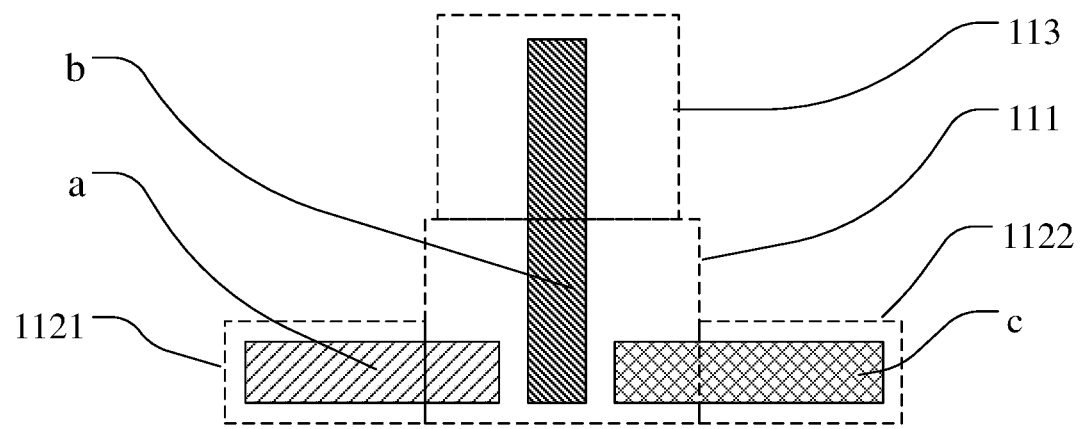
FIG. 15 is a schematic diagram showing a thirteenth pixel design in a repeating unit according to one embodiment of the present disclosure.

FIG. 15 is a schematic diagram showing a thirteenth pixel design in the repeating unit in the electronic device display area 1 according to the present disclosure. As shown in FIG. 15, each of the repeating units includes one pixel unit. The pixel unit includes a first sub-pixel a, a second sub-pixel b, and a third sub-pixel c. The scan line region 112 includes a first scan line region 1121 and a second scan line region 1122. A light-emitting layer of the first sub-pixel a is disposed in the first scan line region 1121 and the circuit region 111. A light-emitting layer of the second sub-pixel b is disposed in the circuit region 111 and the data line region 113. A light-emitting layer of the third sub-pixel c is disposed in the circuit region 111 and the second scan line region 1122.

Figure 16:
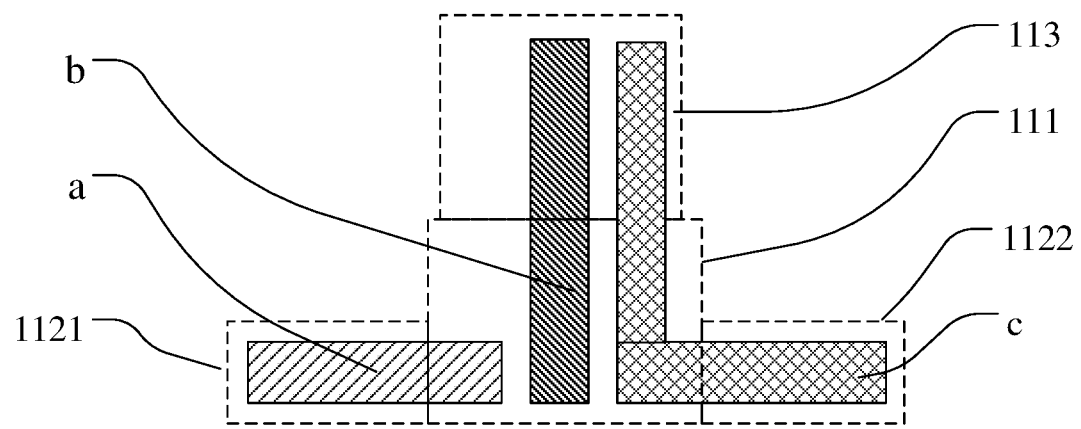
FIG. 16 is a schematic diagram showing a fourteenth pixel design in a repeating unit according to one embodiment of the present disclosure.

FIG. 16 is a schematic diagram showing a fourteenth pixel design in the repeating unit in the electronic device display area 1 according to the present disclosure. As shown in FIG. 16, each of the repeating units includes one pixel unit. The pixel unit includes a first sub-pixel a, a second sub-pixel b, and a third sub-pixel c. The scan line region 112 includes a first scan line region 1121 and a second scan line region 1122. A light-emitting layer of the first sub-pixel a is disposed in the first scan line region 1121 and the circuit region 111. A light-emitting layer of the second sub-pixel b is disposed in the circuit region 111 and the data line region 113. A light-emitting layer of the third sub-pixel c is disposed in the circuit region 111, the data line region 113, and the second scan line region 1122.

Figure 17:
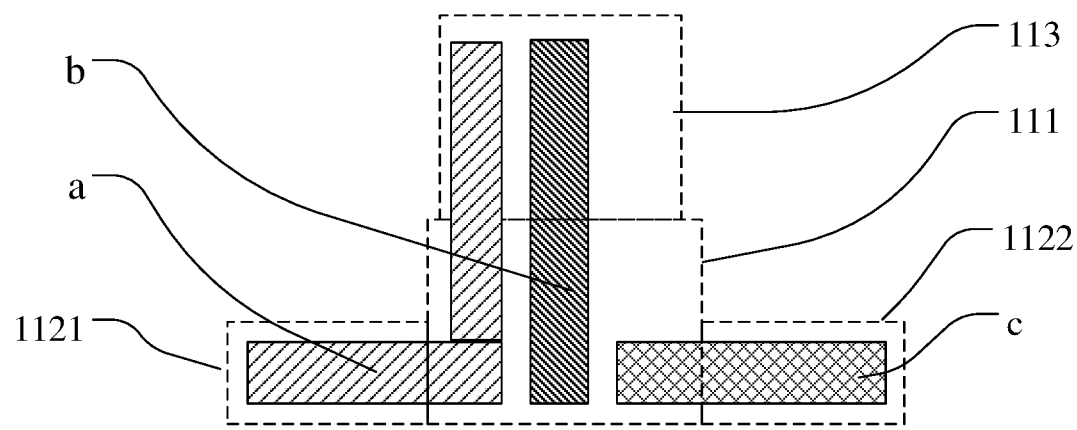
FIG. 17 is a schematic diagram showing a fifteenth pixel design in a repeating unit according to one embodiment of the present disclosure.

FIG. 17 is a schematic diagram showing a fifth pixel design in the repeating unit in the electronic device display area 1 according to the present disclosure. As shown in FIG. 17, each of the repeating units includes one pixel unit. The pixel unit includes a first sub-pixel a, a second sub-pixel b, and a third sub-pixel c. The scan line region 112 includes a first scan line region 1121 and a second scan line region 1122. A light-emitting layer of the first sub-pixel a is disposed in the first scan line region 1121 and the data line region 113. A light-emitting layer of the second sub-pixel b is disposed in the circuit region 111 and the data line region 113. A light-emitting layer of the third sub-pixel c is disposed in the circuit region 111 and the second scan line region 1122.

Figure 18:
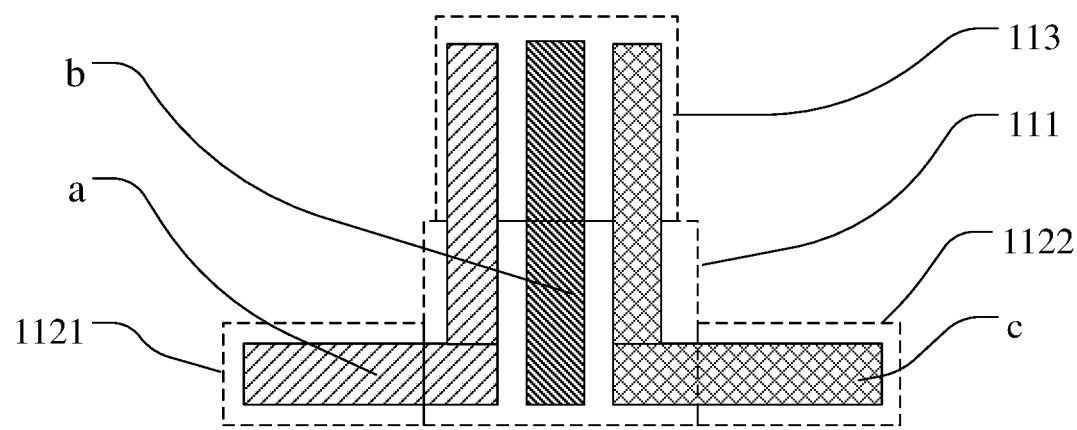
FIG. 18 is a schematic diagram showing a sixteenth pixel design in a repeating unit according to one embodiment of the present disclosure.

FIG. 18 is a schematic diagram showing a sixteenth pixel design in the repeating unit in the electronic device display area 1 according to the present disclosure. As shown in FIG. 18, each of the repeating units includes one pixel unit. The pixel unit includes a first sub-pixel a, a second sub-pixel b, and a third sub-pixel c. The scan line region 112 includes a first scan line region 1121 and a second scan line region 1122. A light-emitting layer of the first sub-pixel a is disposed in the first scan line region 1121, the circuit region 111, and the data line region 113. A light-emitting layer of the second sub-pixel b is disposed in the circuit region 111 and the data line region 113. A light-emitting layer of the third sub-pixel c is disposed in the circuit region 111, the data line region 113, and the second scan line region 1122.

Figure 19:
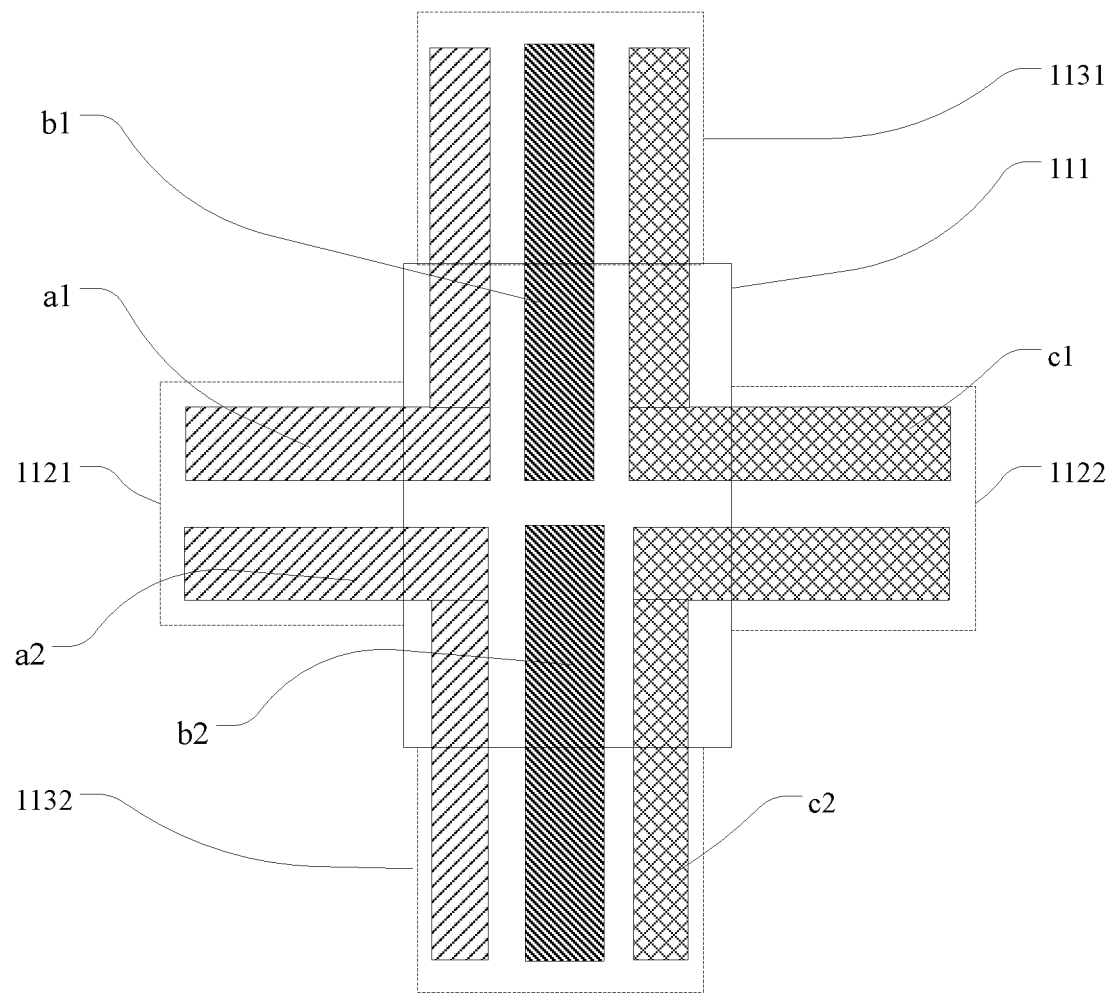
FIG. 19 is a schematic diagram showing a seventeenth pixel design in a repeating unit according to one embodiment of the present disclosure.

FIG. 19 is a schematic diagram showing a seventeenth pixel design in the repeating unit in the electronic device display area 1 according to the present disclosure. As shown in FIG. 19, each of the repeating units includes two pixel units. The two pixel units are arranged in a mirror image of each other with respect to a central line of the data line region. Each of the pixel units includes a first sub-pixel a (i.e., the elements a1 and a2 shown in FIG. 19), a second sub-pixel b (i.e., the elements b1 and b2 shown in FIG. 19), and a third sub-pixel c (i.e., the elements c1 and c2 shown in FIG. 19). The scan line region 112 includes a first scan line region 1121 and a second scan line region 1122. The data line region 113 includes a first data line region 1131 and a second data line region 1132. A light-emitting layer of the first sub-pixel a is disposed in the first scan line region 1121, the circuit region 111, and the data line region 113. A light-emitting layer of the second sub-pixel b is disposed in the circuit region 111 and the data line region 113. A light-emitting layer of the third sub-pixel c is disposed in the circuit region 111, the data line region 113, and the second scan line region 1122.

Figure 20:
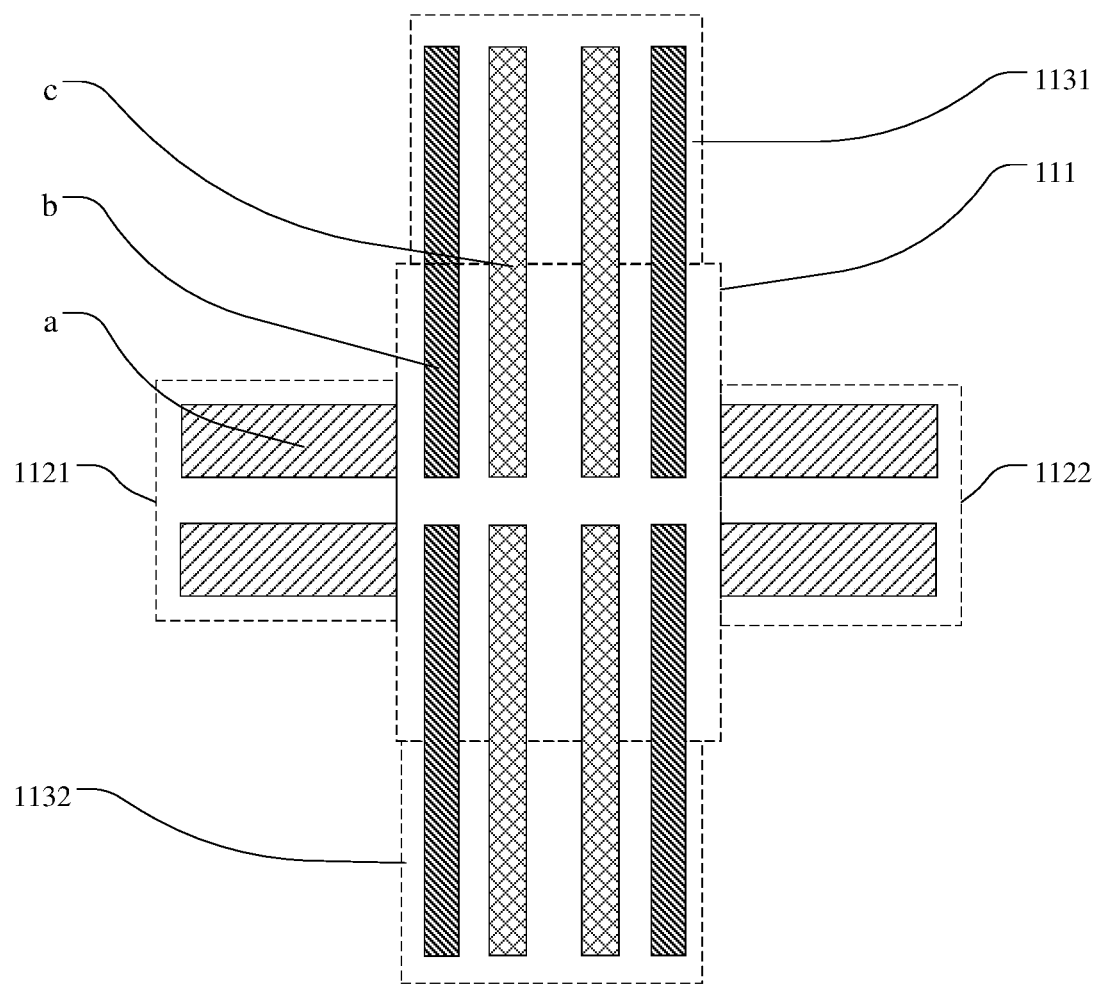
FIG. 20 is a schematic diagram showing an eighteenth pixel design in a repeating unit according to one embodiment of the present disclosure.

FIG. 20 is a schematic diagram showing an eighteenth pixel design in the repeating unit in the electronic device display area 1 according to the present disclosure. As shown in FIG. 20, each of the repeating units includes four pixel units. The four pixel units are symmetrical to each other with respect to a center of the circuit region. Each of the pixel units includes a first sub-pixel a, a second sub-pixel b, and a third sub-pixel c. The scan line region 112 includes a first scan line region 1121 and a second scan line region 1122. The data line region 113 includes a first data line region 1131 and a second data line region 1132. A light-emitting layer of the first sub-pixel a is disposed in the scan line region 112. Both a light-emitting layer of the second sub-pixel b and a light-emitting layer of the third sub-pixel c are disposed in the circuit region 111 and the data line region 113.

In each of the repeating units shown in FIGS. 3-20, any two adjacent sub-pixels in a vertical direction or horizontal direction are distanced from each other by 18-30 µm. Any two adjacent repeating units in the horizontal direction are distanced from each other by 18-30 µm. Any two adjacent repeating units in the vertical direction are distanced from each other by 35-60 µm.

A ratio of the opening (i.e., an aperture ratio) of the pixels in the electronic device display area can be adjusted by adjusting shapes and sizes of the first sub-pixel, the second first sub-pixel, and the third first sub-pixel in each of the repeating units.

In on embodiment, as shown in FIG. 18, each of the repeating units includes one pixel unit. The pixel unit includes a first sub-pixel a, a second sub-pixel b, and a third sub-pixel c. The first sub-pixel is disposed along the light transparency area, the third sub-pixel is disposed along the light transparency area, and the second sub-pixel is disposed between the first sub-pixel and the third sub-pixel. The first sub-pixel is symmetrical to the third sub-pixel with respect to an axis line of the second sub-pixel.

In on embodiment, as shown in FIG. 18, an opening of a pixel defining layer configured for defining the first sub-pixel has an L shape, an opening of a pixel defining layer configured for defining the second sub-pixel has a rectangular shape, and an opening of a pixel defining layer configured for defining the third sub-pixel has an L shape.

In on embodiment, as shown in FIG. 19, each of the repeating units includes a first pixel unit and a second pixel unit arranged in a mirror image of each other in a vertical direction. The first pixel unit includes a first red sub-pixel a1, a first green sub-pixel b1, and a first blue sub-pixel c1. The second pixel unit includes a second red sub-pixel a2, a second green sub-pixel b2, and a second blue sub-pixel c2. The first red sub-pixel, the first blue sub-pixel, the second red sub-pixel, and the second blue sub-pixel are disposed along the light transparency area. The first green sub-pixel is disposed between the first red sub-pixel and the first blue sub-pixel. The second green sub-pixel is disposed between the second red sub-pixel and the second blue sub-pixel.

In on embodiment, as shown in FIG. 19, an opening of a pixel defining layer configured for defining the first red sub-pixel and an opening of a pixel defining layer configured for defining the first blue sub-pixel have an L shape, and the L shape of the opening of the pixel defining layer configured for defining the first red sub-pixel is symmetrical to the L shape of the opening of the pixel defining layer configured for defining the first blue sub-pixel in a horizontal direction. An opening of a pixel defining layer configured for defining the first green sub-pixel has a rectangular shape. An opening of a pixel defining layer configured for defining the second red sub-pixel and an opening of a pixel defining layer configured for defining the second blue sub-pixel have an upside-down L shape, and the upside-down L shape of the opening of the pixel defining layer configured for defining the second red sub-pixel is symmetrical to the upside-down L shape of the opening of the pixel defining layer configured for defining the second blue sub-pixel in the horizontal direction. An opening of a pixel defining layer configured for defining the second green sub-pixel has a rectangular shape.

In one embodiment, the OLED display panel further includes a standard display area 2 surrounding the electronic device display area 1. Any two adjacent pixels in the electronic device display area 1 do not share a sub-pixel (that is, a Real RGB pixel structure is adopted), and any two adjacent pixels in the standard display area 2 share a sub-pixel so as to increase resolution of the display screen.

In one embodiment, the present disclosure provides a display device including an organic light-emitting diode (OLED) display panel. The OLED display panel includes an electronic device display area positioned to correspond to an electronic device. The electronic device display area includes a plurality of repeating units arranged in an array. Each of the repeating units includes at least one pixel unit disposed therein. Each of the repeating units includes:

a pixel circuit area including a circuit region defined by a plurality of driving circuits densely disposed in sub-pixels of the pixel unit, a scan line region defined by a plurality of scan lines densely disposed in sub-pixels of the pixel unit, and a data line region defined by a plurality of data lines densely disposed in sub-pixels of the pixel unit; and a light transparency area including a portion of the electronic device display area where the pixel circuit area is not included, the light transparency area not including a light shielding material disposed therein;

wherein a light-emitting layer of at least one sub-pixel in the pixel unit is disposed in at least two of the circuit region, the scan line region, and the data line region.

In one embodiment of the display device according to the present disclosure, each of the repeating units comprises one pixel unit; the pixel unit includes a first sub-pixel, a second sub-pixel, and a third sub-pixel; and a light-emitting layer of the first sub-pixel is disposed in the scan line region.

In one embodiment of the display device according to the present disclosure, both a light-emitting layer of the second sub-pixel and a light-emitting layer of the third sub-pixel are disposed in the circuit region and the data line region.

In one embodiment of the display device according to the present disclosure, a light-emitting layer of the second sub-pixel is disposed in the circuit region, and a light-emitting layer of the third sub-pixel is disposed in the circuit region and the data line region.

In one embodiment of the display device according to the present disclosure, a light-emitting layer of the second sub-pixel is disposed in the circuit region, the scan line region, and the data line region; and a light-emitting layer of the third sub-pixel is disposed in the circuit region and the data line region.

From the above embodiments, it is understood that the present disclosure provides an organic light-emitting diode (OLED) display panel and a display device, which include an electronic device display area positioned to correspond to an electronic device. The electronic device display area includes a plurality of repeating units arranged in an array. Each of the repeating units includes at least one pixel unit disposed therein. Each of the repeating units includes: a pixel circuit area including a circuit region defined by a plurality of driving circuits densely disposed in sub-pixels of the pixel unit, a scan line region defined by a plurality of scan lines densely disposed in sub-pixels of the pixel unit, and a data line region defined by a plurality of data lines densely disposed in sub-pixels of the pixel unit; and a light transparency area including a portion of the electronic device display area where the pixel circuit area is not included, the light transparency area not including a light shielding material disposed therein; wherein a light-emitting layer of at least one sub-pixel in the pixel unit is disposed in at least two of the circuit region, the scan line region, and the data line region. Because, in this structure, a light transparency area is included in the electronic device display area, external light passes through the light transparency area and enters the camera. Thus, the camera can be directly positioned under the display panel without the need of forming a hole, thus solving the problems existing in prior art where the electronic device display area cannot display images due to formation of the hole. Full screen display is achieved. In the meanwhile, because the light-emitting layer of the sub-pixels is disposed in at least two of the circuit region, the scan line region, and the data line region, an aperture ratio of the pixels is increased.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An organic light-emitting diode (OLED) display panel comprising an electronic device display area positioned to correspond to an electronic device, wherein the electronic device display area comprises a plurality of repeating units arranged in an array, and each of the repeating units comprises at least one pixel unit disposed therein, each of the repeating units comprising:

a pixel circuit area including a circuit region defined by a plurality of driving circuits densely disposed in sub-pixels of the pixel unit, a scan line region defined by a plurality of scan lines densely disposed in sub-pixels of the pixel unit, and a data line region defined by a plurality of data lines densely disposed in sub-pixels of the pixel unit; and a light transparency area including a portion of the electronic device display area where the pixel circuit area is not included, the light transparency area not including a light shielding material disposed therein;

wherein a light-emitting layer of at least one sub-pixel in the pixel unit is disposed in at least two of the circuit region, the scan line region, and the data line region, wherein each of the repeating units comprises one pixel unit; the pixel unit includes a first sub-pixel, a second sub-pixel, and a third sub-pixel; the first sub-pixel is disposed along the light transparency area, the third sub-pixel is disposed along the light transparency area, and the second sub-pixel is disposed between the first sub-pixel and the third sub-pixel; and the first sub-pixel is symmetrical to the third sub-pixel with respect to an axis line of the second sub-pixel.

2. The OLED display panel according to claim 1, wherein each of the repeating units comprises one pixel unit; the pixel unit includes a first sub-pixel, a second sub-pixel, and a third sub-pixel; and a light-emitting layer of the first sub-pixel is disposed in the scan line region.

3. The OLED display panel according to claim 2, wherein a light-emitting layer of the second sub-pixel is disposed in the circuit region, and a light-emitting layer of the third sub-pixel is disposed in the circuit region and the data line region.

4. The OLED display panel according to claim 1, wherein each of the repeating units comprises one pixel unit; the pixel unit includes a first sub-pixel, a second sub-pixel, and a third sub-pixel; and a light-emitting layer of the first sub-pixel is disposed in the scan line region and the circuit region.

5. The OLED display panel according to claim 1, wherein an opening of a pixel defining layer configured for defining the first sub-pixel has an L shape, an opening of a pixel defining layer configured for defining the second sub-pixel has a rectangular shape, and an opening of a pixel defining layer configured for defining the third sub-pixel has an L shape.

6. The OLED display panel according to claim 1, wherein the scan line region includes a first scan line region and a second scan line region; the data line region includes a first data line region and a second data line region; each of the repeating units comprises two pixel units;

the two pixel units are arranged in a mirror image of each other with respect to a central line of the data line region; each of the pixel units includes a first sub-pixel, a second sub-pixel, and a third sub-pixel; a light-emitting layer of the first sub-pixel is disposed in the first scan line region, the circuit region, and the first data line region; a light-emitting layer of the second sub-pixel is disposed in the circuit region and the first data line region; and a light-emitting layer of the third sub-pixel is disposed in the first data line region, the circuit region, and the second scan line region.

7. A display device comprising an organic light-emitting diode (OLED) display panel, the OLED display panel comprising an electronic device display area positioned to correspond to an electronic device, wherein the electronic device display area comprises a plurality of repeating units arranged in an array, and each of the repeating units comprises at least one pixel unit disposed therein, each of the repeating units comprising:

a pixel circuit area including a circuit region defined by a plurality of driving circuits densely disposed in sub-pixels of the pixel unit, a scan line region defined by a plurality of scan lines densely disposed in sub-pixels of the pixel unit, and a data line region defined by a plurality of data lines densely disposed in sub-pixels of the pixel unit; and a light transparency area including a portion of the electronic device display area where the pixel circuit area is not included, the light transparency area not including a light shielding material disposed therein;

wherein a light-emitting layer of at least one sub-pixel in the pixel unit is disposed in at least two of the circuit region, the scan line region, and the data line region, wherein each of the repeating units comprises one pixel unit; the pixel unit includes a first sub-pixel, a second sub-pixel, and a third sub-pixel; the first sub-pixel is disposed along the light transparency area, the third sub-pixel is disposed along the light transparency area, and the second sub-pixel is disposed between the first sub-pixel and the third sub-pixel; and the first sub-pixel is symmetrical to the third sub-pixel with respect to an axis line of the second sub-pixel.

8. The display device according to claim 7, wherein each of the repeating units comprises one pixel unit; the pixel unit includes a first sub-pixel, a second sub-pixel, and a third sub-pixel; and a light-emitting layer of the first sub-pixel is disposed in the scan line region.

9. The display device according to claim 8, wherein a light-emitting layer of the second sub-pixel is disposed in the circuit region, and a light-emitting layer of the third sub-pixel is disposed in the circuit region and the data line region.

* * * * *